US007030434B1

(12) United States Patent
Krautschneider et al.

(10) Patent No.: US 7,030,434 B1
(45) Date of Patent: Apr. 18, 2006

(54) ARRANGEMENT WITH IMAGE SENSORS

(75) Inventors: Wolfgang Krautschneider, Hamburg (DE); Heribert Geib, Grafing (DE); Franz Hofmann, München (DE); Till Schlösser, Dresden (DE)

(73) Assignee: Infineon Technologies AG, Munich (DE)

( * ) Notice: Subject to any disclaimer, the term of this patent is extended or adjusted under 35 U.S.C. 154(b) by 786 days.

(21) Appl. No.: 10/089,570

(22) PCT Filed: Sep. 28, 2000

(86) PCT No.: PCT/EP00/09519

§ 371 (c)(1),
(2), (4) Date: Jul. 23, 2002

(87) PCT Pub. No.: WO01/24269

PCT Pub. Date: Apr. 5, 2001

(30) Foreign Application Priority Data

Sep. 30, 1999 (DE) ............................... 199 46 983

(51) Int. Cl.
*H01L 31/062* (2006.01)
*H01L 31/113* (2006.01)

(52) U.S. Cl. ...................................... 257/292; 257/291

(58) Field of Classification Search ................ 257/290, 257/291, 292
See application file for complete search history.

(56) References Cited

U.S. PATENT DOCUMENTS 5,025,146 A 6/1991 Kleinschmidt et al. ..... 250/214
5,488,415 A * 1/1996 Uno .......................... 348/241
5,566,044 A 10/1996 Bergemont et al. ...... 361/321.1
5,854,498 A 12/1998 Merrill ....................... 257/292
5,933,190 A 8/1999 Dierickx et al. ............ 348/302
5,952,686 A 9/1999 Chou et al. ................ 257/292
6,350,981 B1 * 2/2002 Uno ....................... 250/214 R

FOREIGN PATENT DOCUMENTS

EP 739 039 10/1996

(Continued)

OTHER PUBLICATIONS

R. Hauschild, et al., "A CMOS Optical Sensor System Performing Image Sampling on a Hexagonal Grid," *ESSCIRC 1996. Proceedings of the 22nd European Solid-State Circuits Conference, Proceedings of ESSCIRC 1996, Neuchatel, Switzerland*, pp. 304-307 1996.

(Continued)

*Primary Examiner*—Ngân V. Ngô
(74) *Attorney, Agent, or Firm*—Peter F. Corless; Steven M. Jensen; Edwards Angell Palmer & Dodge

(57) ABSTRACT

A memory transistor and a selection transistor of an image sensor are connected in series and between a bit line (B5) and a reference line (R5). A gate electrode of the selection transistor is connected to a word line (W5), which extends crosswise in relation to the bit line (B5). A diode of the image sensor is switched between a gate electrode (G5) of the memory transistor and a first source/drain area (S/D5) of the memory transistor, which is connected to the selection transistor in such a way is polarized towards the first source/drain area (S/D5) of the memory transistor and in the reverse direction. A photodiode of the image sensor is switched between a voltage connection and either the gate electrode (G5) of the memory transistor or the first source/drain area (S/D5) of the memory transistor in such a way that it is polarized towards the voltage connection and in the reverse direction.

12 Claims, 6 Drawing Sheets

FOREIGN PATENT DOCUMENTS

Figure 1:
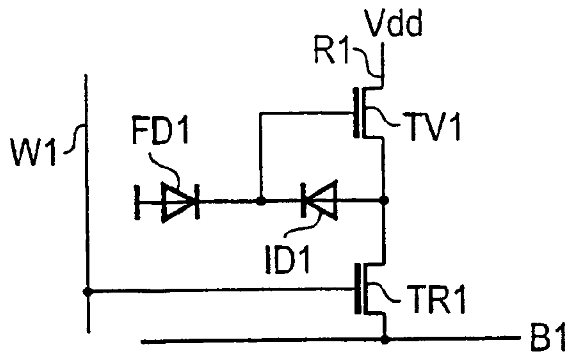

| | | |
|---|---|---|
| EP | 198 25048 | 4/1999 |
| WO | WO 98/58411 | 12/1998 |

OTHER PUBLICATIONS

Eric Y. Chou, et al., "Low Power Salient Integration Mode Image Sensor with a Low Voltage Mixed-Signal Readout Architecture," *Proceedings 1998. International Symposium on Low Power Electronics and Design*, Aug. 10-12, 1998.

Yoshinori Iida, et al., "A 1/4-Inch 330k Square Pixel Progressive Scan CMOS Active Pixel Image Sensor," *IEEE Journal of Solid-State Circuits*, pp. 2042-2047, 1998.

Eric R. Fossum, "CMOS Image Sensors: Electronic Camera On A Chip," *IEEE*. pp. 17-25, 1995.

* cited by examiner

ARRANGEMENT WITH IMAGE SENSORS

The invention relates to an arrangement with image sensors.

Image sensors are designed to produce electrical signals dependent on the intensity and colour of the projected light. To this end the image sensor includes a light-sensitive element. The light-sensitive element has a photoactive face. The light, which is projected onto the photoactive face, is converted by the light-sensitive element into an electrical signal. An arrangement with many image sensors is provided to record an image electrically, as is necessary for example in the case of a camera. The use of image sensors built on CMOS technology in contrast to image sensors built on CCD technology makes it possible to scan the individual image sensors independently from each other. To this end further elements as well as circuits are necessary in addition to the light sensitive elements. These further elements and circuits should only need as small a space as possible in order to achieve the best possible fill factor, that is to say the ratio between photoactive face and total face.

Such an arrangement with image sensors built on CMOS technology, which is suitable for a camera, is described for example in E. R. FOSSUM, "CMOS Image Sensors, Electronic Camera on a Chip," IEDM Dig. Techn. Pap., p. 17, 1995. An image sensor includes as the light-sensitive element a photodiode and three MOS transistors. The circuitry of the transistors corresponds to the circuitry of the transistors in a 3 transistor DRAM cell arrangement. A first and a second transistor are connected in series and between a bit line and a reference line. A third transistor is connected between a gate electrode of the second transistor and the reference line. A gate electrode of the first transistor is connected to a word line extending crosswise in relation to the bit line. A gate electrode of the third transistor is connected to a reset line. The photodiode is switched between a voltage connection and the gate electrode of the second transistor in such a way that it is polarised towards the voltage connection and in the reverse direction.

The invention is based on the problem of providing an arrangement with image sensors built on CMOS technology which is suitable for a camera and in regard to which an image sensor has a higher fill factor in comparison to the prior art.

The problem is solved by an arrangement with image sensors, in which an image sensor has a memory transistor and a selection transistor, which are connected in series and between a bit line and a reference line. A gate electrode of the selection transistor is connected to a word line which extends crosswise in relation to the bit line. The image sensor has a diode, which is switched between a gate electrode of the memory transistor and a first source/drain area of the memory transistor, which is connected to the selection transistor, in such a way that it is polarised towards the first source/drain area of the memory transistor and in the reverse direction. The image sensor has a photodiode as the light-sensitive element, which is switched between a voltage connection and the gate electrode of the memory transistor in such a way that it is polarised towards the voltage connection and in the reverse direction.

A possible mode of operation of this arrangement is explained below:

The reference line is constantly held on an operating voltage $V_{DD}$. The voltage connection is constantly held on 0 Volt. The voltage connection can also be held on a negative voltage.

Reset of the Image Sensor:

The selection transistor is opened via the word line, the voltage $V_{DD}$ is applied to the bit line. Voltage equalizing is achieved between the gate electrode of the memory transistor and $V_{DD}$ via current conduction through the diode. After this (reset) operation $V_{DD}$ lies on the gate electrode of the memory transistor.

"Measurement" of the Image Sensor:

With the selection transistor blocked, light falls onto the photodiode, as a result of which a voltage reduction occurs at the gate electrode of the memory transistor.

Read of the Image Sensor:

After a pre-set time (exposure time) the amount of projected light is determined by the opening of the selection transistor via the word line and the measurement of the signal arising on the bit line. To this end the bit line is previously discharged to earth. The signal on the bit line is dependent on the voltage at the gate electrode of the memory transistor at the start of the read operation. On the one hand the voltage difference between the gate electrode of the memory transistor and the first source/drain area of the memory transistor determines the strength of the current flowing through the memory transistor and therefore the bit line. On the other hand an equalizing current flows over a certain period between the gate electrode of the memory transistor and the first source/drain area of the memory transistor in the reverse direction of the diode until essentially the same voltage lies on the gate electrode of the memory transistor as on the first source/drain area of the memory transistor so that the memory transistor is blocked and no further current can flow onto the bit line. This period depends on the voltage at the gate electrode of the memory transistor at the start of the read operation. This voltage, which correlates with the light incidence, thus determines the signal on the bit line in two respects.

After the read operation a reset is again started.

Since a pair, which consists of a word line and a bit line, is exactly associated with an image sensor, the individual image sensors of the arrangement can be scanned via the word lines and the bit lines. The signals on the bit lines are subsequently built up into an image. The arrangement is therefore suitable for a camera.

The problem is also solved by an arrangement with image sensors, in which an image sensor has a memory transistor and a selection transistor, which are connected in series and between a bit line and a reference line. A gate electrode of the selection transistor is connected to a word line, which extends crosswise in relation to the bit line. The image sensor has a diode, which is switched between a gate electrode of the memory transistor and a first source/drain area of the memory transistor, which is connected to the selection transistor in such a way that it is polarised towards the first source/drain area of the memory transistor and in the reverse direction. The image sensor has a photodiode, which is switched between a voltage connection and the first source/drain area of the memory transistor in such a way that it is polarised towards the voltage connection and in the reverse direction.

A possible mode of operation of such an arrangement is explained below:

The reference line is for example constantly held on an operating voltage $V_{DD}$. The voltage connection is for example constantly held on 0 Volt.

Reset of the Image Sensor:

The selection transistor is opened via the word line. The voltage $V_{DD}$ lies on the bit line. An equalizing current flows via the diode between the gate electrode of the memory transistor and the first source/drain area of the memory transistor, until essentially $V_{DD}$ lies on the gate electrode of the memory transistor.

"Measurement" of the Image Sensor:

With the selection transistor blocked light falls onto the photodiode, which leads to a reduction in the voltage at the first source/drain area of the memory transistor. An equalizing current flows via the diode in the reverse direction between the gate electrode of the memory transistor and the first source/drain area of the memory transistor, until essentially the same voltage lies on the gate electrode of the memory transistor as on the first source/drain area of the memory transistor. The light incidence on the photodiode consequently determines the voltage at the gate electrode of the memory transistor.

Read of the Image Sensor:

The selection transistor is opened via the word line. The signal arising on the bit line is measured. The read operation corresponds to the read operation of the image sensor already described above.

In contrast to the prior art the image sensor is connected with one line less, resulting in a better fill factor. Furthermore the diode can be produced more simply with less space requirement than a transistor, since the diode only has two inputs or outputs, while the transistor has three inputs or outputs (gate electrode and two source/drain areas). Also for this reason the image sensor has a higher fill factor than image sensors according to the prior art.

The diode does not need to meet high requirements. The ratio of current in the conducting direction to current in the reverse direction can be minimal. The diode can thus have a minimum asymmetry.

The readout time can be very short and can be chosen from between 10 ns and 20 ns for example.

The photodiode for example consists of a n-doped area and a p-doped area adjacent to this, which form a p-n transition. Either the n-doped area is arranged on the p-doped area or vice versa. One of the doped areas is wired to the voltage connection.

The colour sensitivity of the image sensor can be adjusted via the depth of the p-n transition of the photodiode. The thickness of the upper doped area, i.e. the depth of the p-n transition, is for example between 100 and 600 nm. The doping substance concentration of the upper doped area is for example between $5\times10^{18}$ $cm^{-3}$ and $10^{20}$ $cm^{-3}$. The doping substance concentration of the lower doped area is for example between $10^{16}$ $cm^{-3}$ and $10^{18}$ $cm^{-3}$.

The photodiode can be connected via the substrate. For example the p-doped area is part of a well in the substrate. The voltage connection for example is adjacent to the substrate outside the arrangement of the image sensors.

To increase the fill factor it is advantageous if the n-doped area of the photodiode, the first source/drain area of the memory transistor and/or a first source/drain area of the selection transistor form a cohesive doped area.

To increase the fill factor it is advantageous if the memory transistor is designed as a vertical transistor. The memory transistor owing to its vertical arrangement has lesser space requirement than if it were designed as a planar transistor.

The first source/drain area of the memory transistor is preferably arranged over a second source/drain area of the memory transistor, which is connected to the reference line. As a result the fill factor is increased, since the reference line is buried in the substrate and therefore the photodiode cannot create a shadow. The photodiode consequently can be arranged over the reference line in such a way that the reference line does not reduce the fill factor.

The diode can be designed as a tunnel diode. A particularly high fill factor can be achieved if the diode is integrated with the memory transistor, since then it does not require any space additional to the memory transistor. The diode in this case consists of the first source/drain area of the memory transistor, an insulating layer adjacent to this and a conductive structure adjacent to this, which is connected to the gate electrode of the memory transistor. The conductive structure, as the gate electrode of the memory transistor, consists preferably of doped polysilicon. So that the reverse direction of the diode points in the right direction, the doping substance concentration of the conductive structure is less than that of the gate electrode and less than that of the first source/drain area of the memory transistor.

It is within the scope of the invention if a substrate has a recess, which extends into the reference line. At least one lateral face of an upper area of the recess is provided with the insulating layer. The insulating layer consequently lies essentially vertically to a surface of the substrate, from which the recess originates. Faces of a lower part of the recess lying below the upper part are provided with a gate insulator. The gate electrode of the memory transistor is arranged in the lower part. The conductive structure of the diode is arranged in the upper area of the recess. Thus the conductive structure is arranged on the gate electrode. The first source/drain area of the memory transistor is arranged in the substrate and is adjacent to the lateral face of the upper area. Part of the reference line acts as second source/drain area of the memory transistor.

The fill factor can be further increased if the selection transistor is designed as a vertical transistor. Alternatively the selection transistor is designed as a planar transistor.

The image sensors for example are arranged in rows and columns. The bit lines and word lines extend along the rows and the columns.

Embodiments of the invention are explained in more detail below by way of the figures.

FIG. 1 shows the circuit of a first image sensor.

Figure 2A:
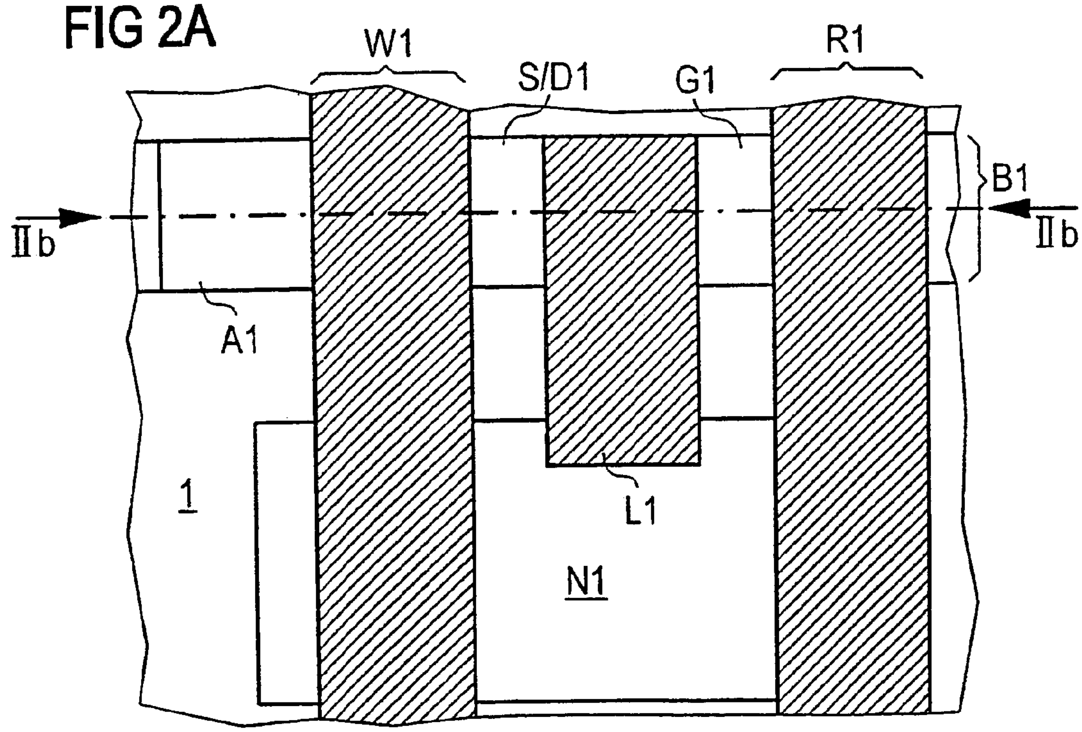

FIG. 2*a* shows a top view onto a first substrate with the first image sensor, in which a reference line, a word line, a gate electrode and a first source/drain area of a memory transistor, a conductive structure, a n-doped area of a photodiode, a first source/drain area and a second source/drain area of the selection transistor and a bit line are shown.

Figure 2B:
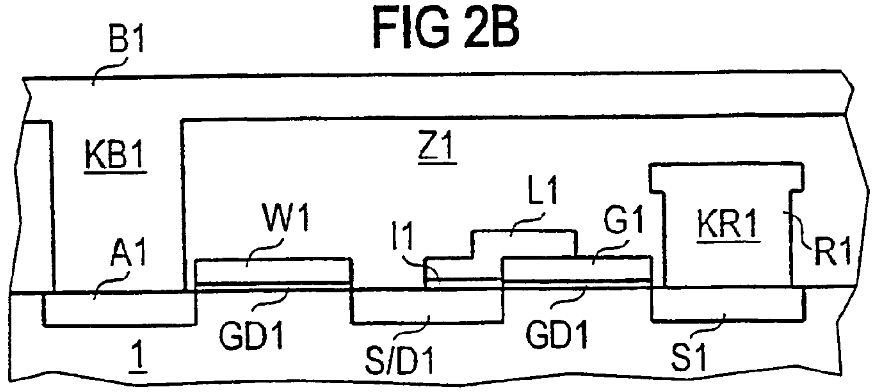

FIG. 2*b* shows a section through the top view from FIG. 2*a*, in which a gate insulator, the gate electrode of the memory transistor, the conductive structure, the word line, the reference line, the bit line, an intermediate oxide, contacts, the first source/drain area of the memory transistor, the first source/drain area of a selection transistor, the second source/drain area of the selection transistor, an insulating layer and a second source/drain area of the memory transistor are shown.

Figure 3:
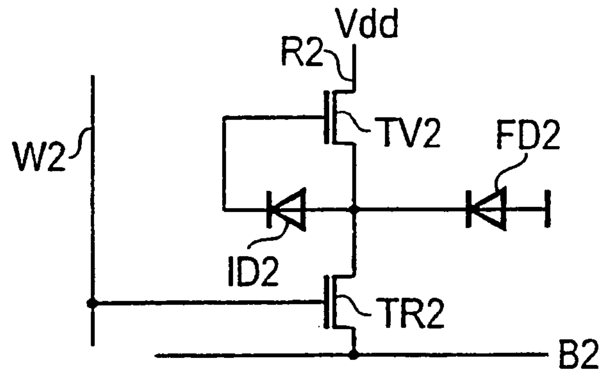

FIG. 3 shows the circuit of a second image sensor.

Figure 4A:
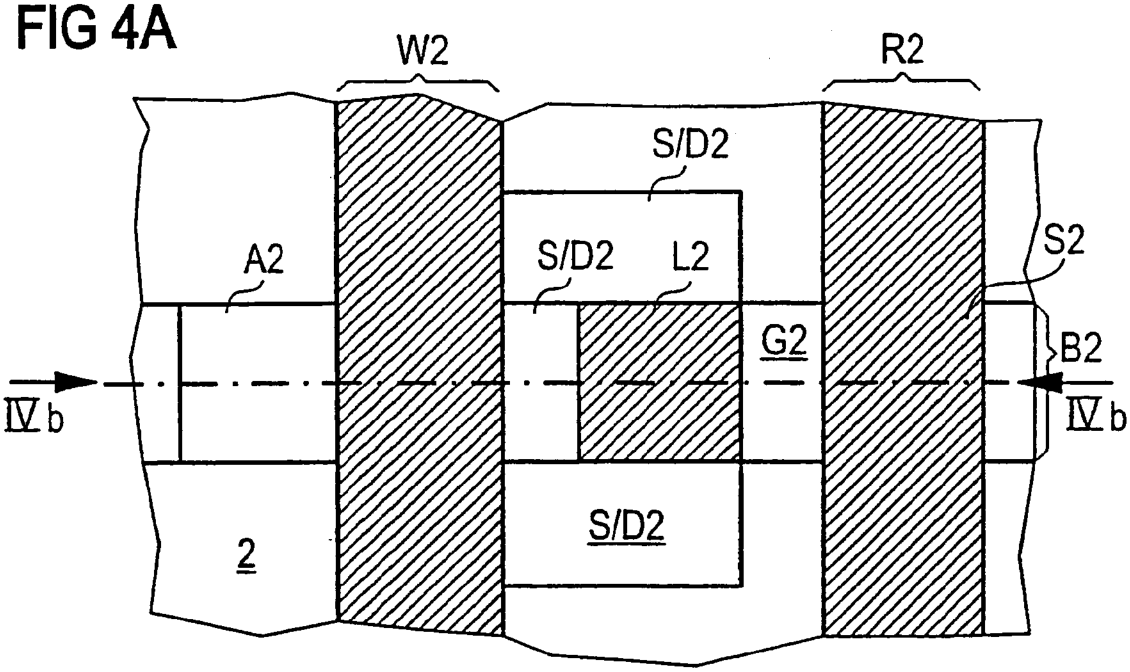

FIG. 4*a* shows the top view onto a second substrate with a second image sensor, in which a reference line, a word line, a bit line, a gate electrode, a first source/drain area and a second source/drain area of a memory transistor, a first source/drain area and a second source/drain area of a selection transistor, a conductive structure and a n-doped area of a photodiode are shown.

Figure 4B:
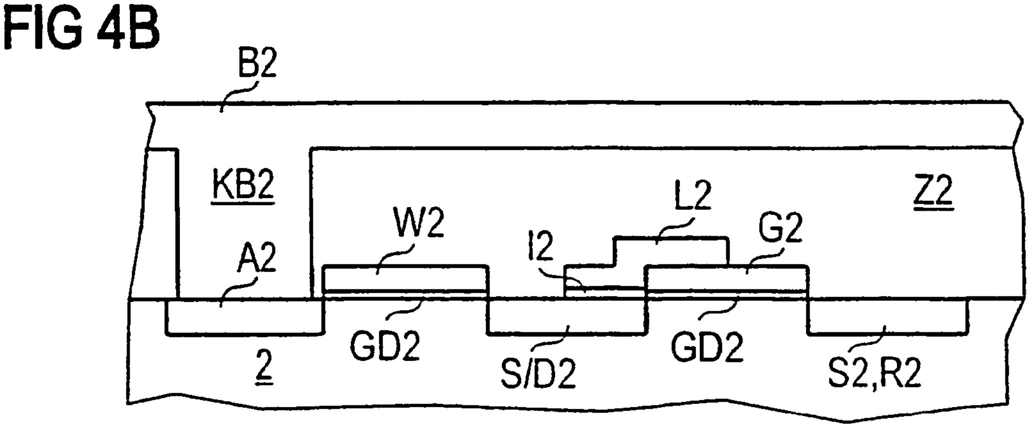

FIG. 4*b* shows a cross-section through the second substrate, in which the bit line, an intermediate oxide, a contact, the word line, the reference line, the gate electrode, the first source/drain area and the second source/drain area of the memory transistor, the conductive structure, the n-doped area of the photodiode, an insulating layer, the first source/drain area and the second source/drain area of the selection transistor and a gate insulator are shown.

Figure 5A:
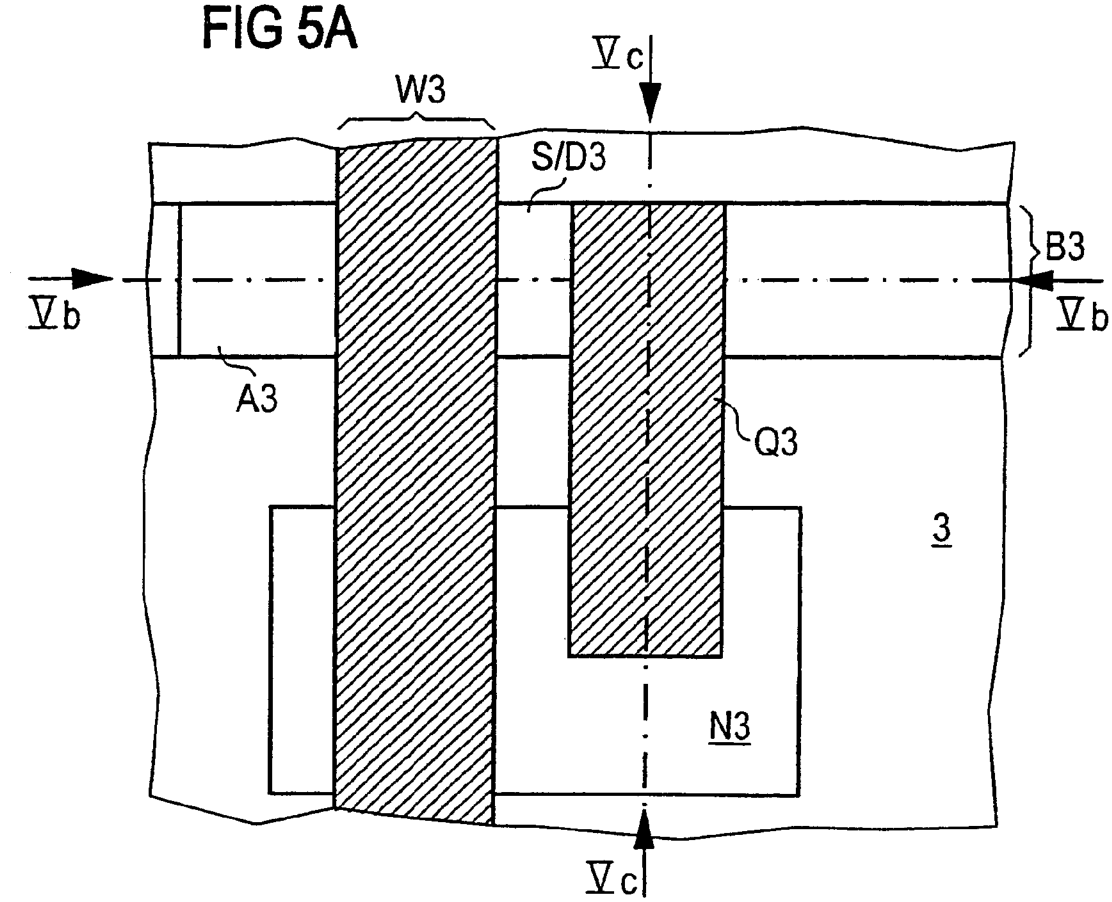

FIG. 5*a* shows a top view onto a third substrate with a third image sensor, in which a word line, a bit line, a n-doped area of a photodiode, a first and a second source/drain area of a selection transistor, a first source/drain area of a memory transistor and a line are shown.

Figure 5B:
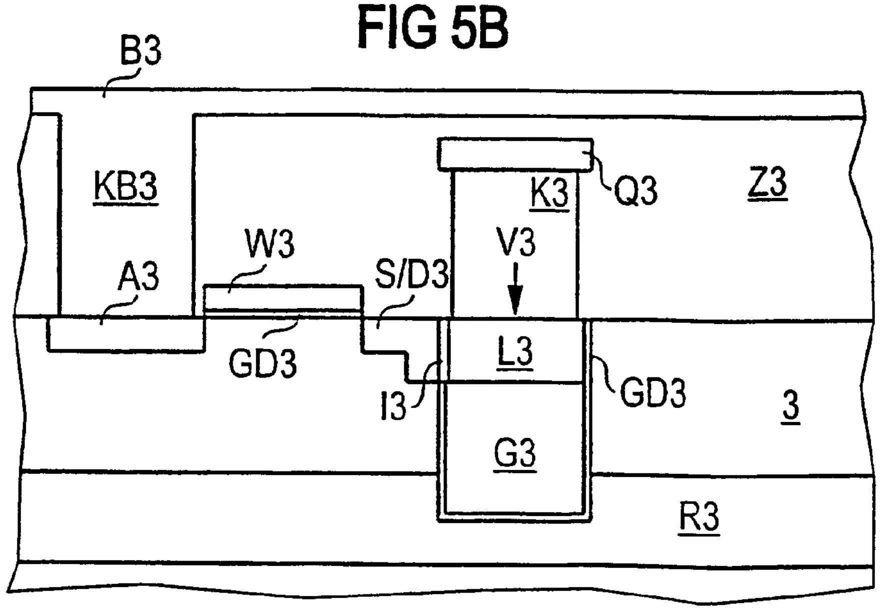

FIG. 5*b* shows a first cross-section through the third substrate, in which the line, contacts, the word line, the bit line, an intermediate oxide, a recess, a conductive structure, an insulating layer, a gate electrode and a first source drain area of a memory transistor, a first source/drain area and a second source/drain area of the selection transistor, an intermediate oxide, a reference line and a gate insulator are shown.

Figure 5C:
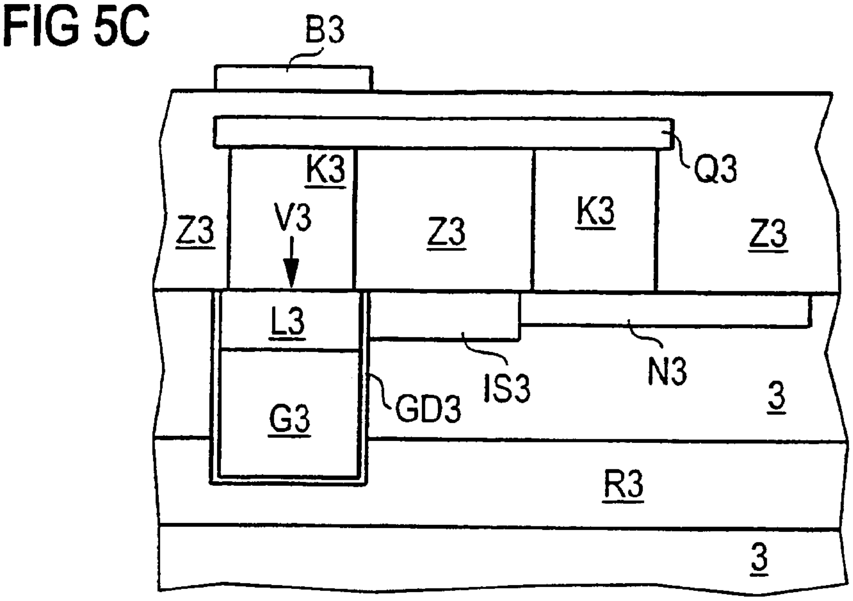

FIG. 5*c* shows a second cross-section through the third substrate vertical to the first cross-section, in which the line, contacts, the bit line, the n-doped area of the photodiode, an insulation, the recess, a conductive structure, an insulating layer, the gate electrode of the memory transistor, the gate insulator, the reference line and the intermediate oxide are shown.

Figure 6A:
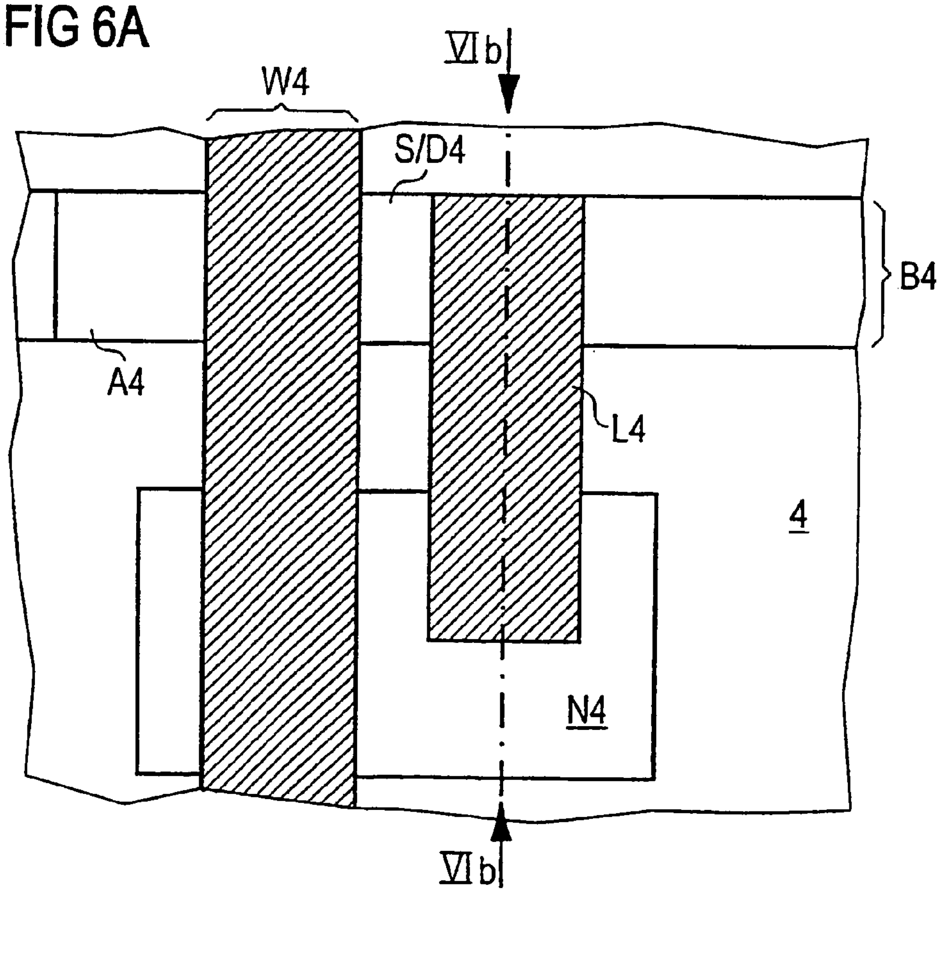

FIG. 6*a* shows a top view onto a fourth substrate with a fourth image sensor, in which a word line, a bit line, a n-doped area of a photodiode, a first source/drain area and a second source/drain area of a selection transistor, a first source/drain area of a memory transistor and a conductive structure are shown.

Figure 6B:
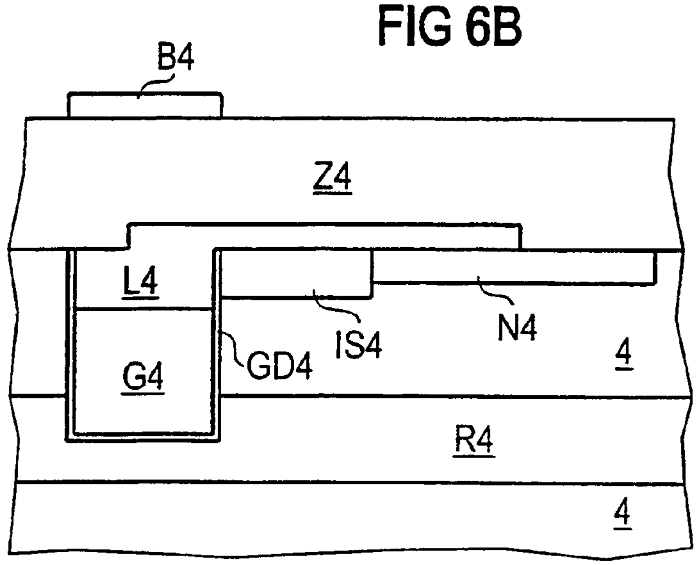

FIG. 6*b* shows a cross-section through the fourth substrate, in which the n-doped area of the photodiode, the conductive structure, an insulation, a gate electrode of the memory transistor, a reference line, the bit line, an intermediate oxide and a gate insulator are shown.

Figure 7A:
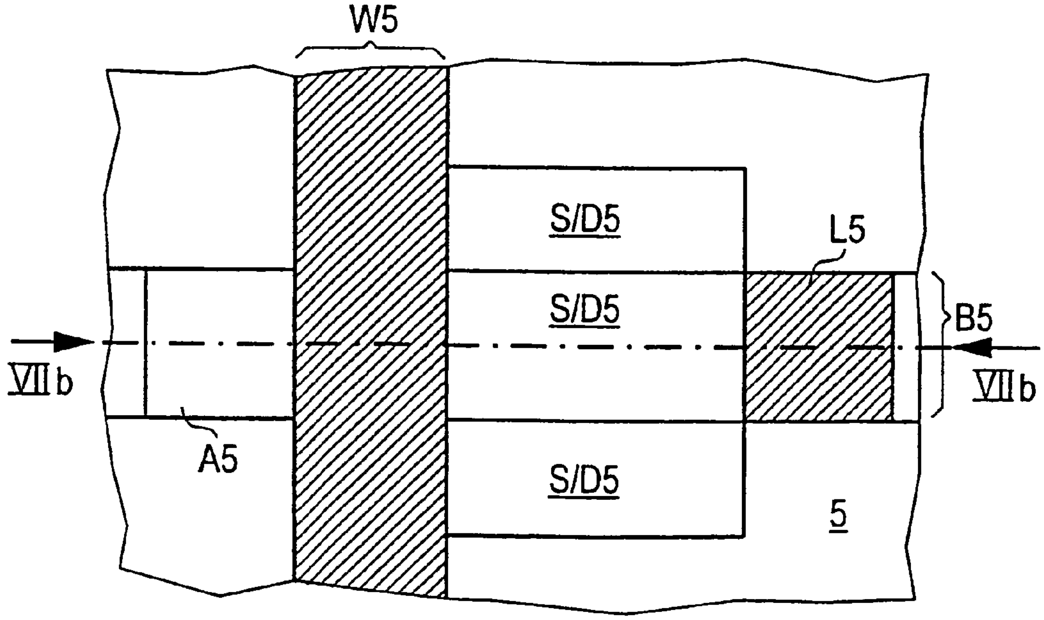

FIG. 7*a* shows a top view onto a fifth substrate with a fifth image sensor, in which a word line, a bit line, a first and a second source/drain area of a selection transistor, a first source/drain area of a memory transistor, a n-doped area of a photodiode and a conductive structure are shown.

Figure 7B:
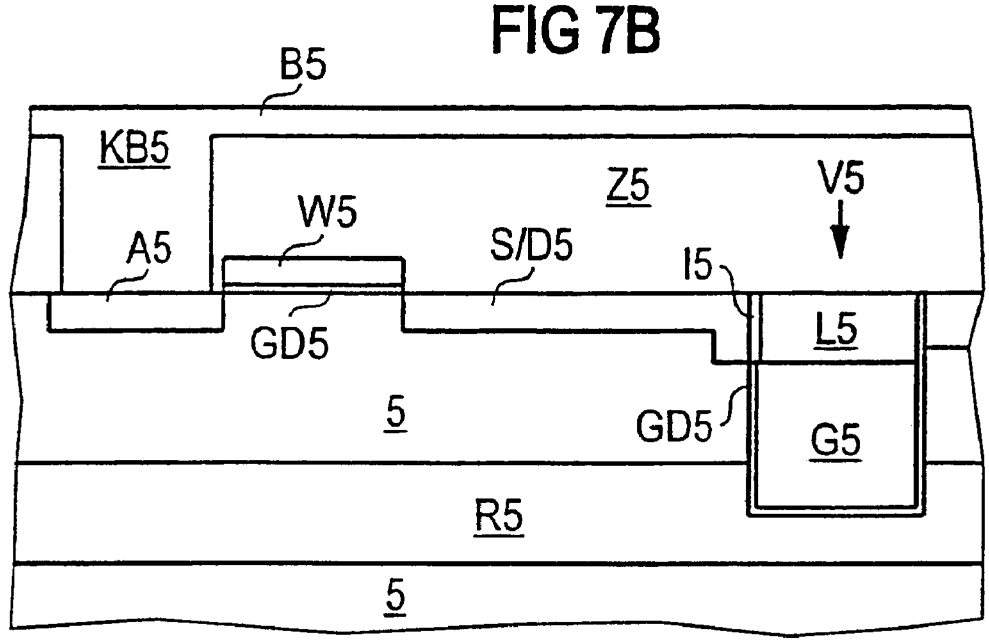

FIG. 7*b* shows the cross-section through the fifth substrate, in which a recess, the conductive structure, a gate electrode and the first source/drain area of the memory transistor, a gate insulator, an insulating layer, the n-doped area of the photodiode, the word line, the first and the second source/drain area of the selection transistor, the bit line, an intermediate oxide, a contact and a reference line are shown.

Figure 8:
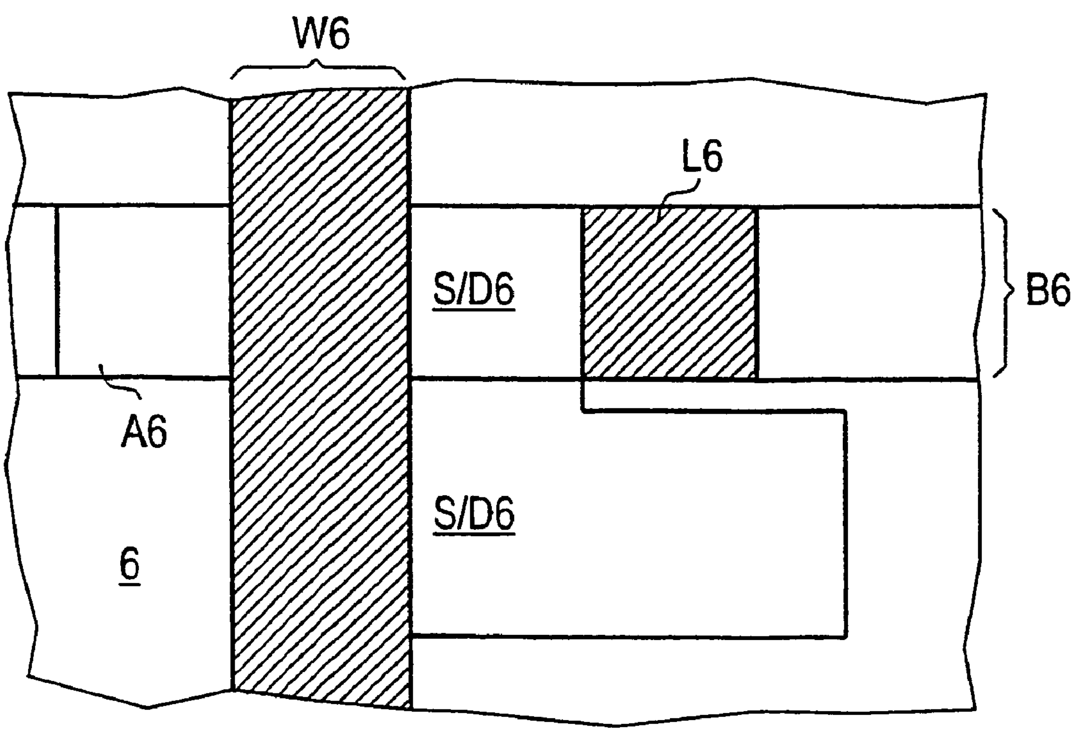

FIG. 8 shows a top view onto a sixth substrate with a sixth image sensor, in which a n-doped area of a photodiode, a first and a second source/drain area of a selection transistor, a first source/drain area of a memory transistor, a conductive structure, a word line and a bit line are shown.

The figures are not drawn to scale.

In a first embodiment a first image sensor of an arrangement with image sensors includes a memory transistor TV1, a selection transistor TR1, a diode ID1 and a photodiode FD1, which are connected to each other according to claim 1 (see FIG. 1).

The memory transistor TV1 and the selection transistor TR1 are designed as planar MOS-transistors in the vicinity of a surface of a first substrate 1. The first substrate 1 has a doping substance concentration of approx. $10^{17}$ $cm^{-3}$ and is p-doped in the vicinity of the transistor. This area is also described as well. The first source/drain area of the memory transistor TV1 and a first source/drain area of the selection transistor TR1 form a cohesive n-doped area S/D1 in the first substrate 1.

The doped area S/D1, a second n-doped source/drain area S1 of the memory transistor TV1 and a second n-doped source/drain area A1 of the selection transistor TR1 are arranged in a row next to each other, at a distance from each other and comprise a doping substance concentration of approx. $10^{20}$ $cm^{-3}$. The doped area S/D1, the second n-doped source/drain area S1 of the memory transistor TV1 and the second n-doped source/drain area A1 of the selection transistor TR1 comprise a square horizontal cross-section, that is to say parallel to the surface of the first substrate 1 with a side length of approx. 250 nm.

Between the second source/drain area A1 of the selection transistor TR1 and the doped area S/D1 a gate electrode of the selection transistor TR1 is arranged on the first substrate 1, which is part of a word line W1 (see FIGS. 2*a* and 2*b*). The word line W1 is approx. 250 nm wide.

Between the doped area S/D1 and the second source/drain area S1 of the memory transistor TV1 a gate electrode G1 of the memory transistor TV1 is arranged on the first substrate 1. The gate electrode G1 of the memory transistor TV1 consists of n-doped polysilicon and has a doping substance concentration of approx. $10^{20}$ $cm^{-3}$. The gate electrode G1 of the memory transistor TV1 has a square horizontal parallel cross-section with a side length of approx. 250 nm.

A gate insulator GD1 separates the word line W1 and the gate electrode G1 of the memory transistor TV1 from the first substrate 1.

An insulating layer I1 is arranged on the doped area S/D1, which is adjacent to the gate electrode G1 of the memory transistor TV1 (see FIG. 2*b*). A conductive structure L1 is arranged on the insulating layer I1, which overlaps the gate electrode G1 of the memory transistor TV1. The conductive structure L1 can for example be produced by precipitating and structuring a layer deposited in a conform way from n-doped polysilicon. The conductive structure L1 is n-doped and has a doping substance concentration of approx. $10^{19}$ $cm^{-3}$. A dimension parallel to the bit line B1 of the conductive structure L1 is approx 250 nm. A dimension parallel to the word line W1 of the conductive structure L1 is approx. 250 nm.

Adjacent to the surface of the first substrate 1 an approx. 200 nm thick n-doped area N1 of the photodiode FD1 is arranged at a distance of approx. 250 nm from the doped area S/D1. A dimension vertical to the word line W1, which is parallel to the surface of the substrate 1, of the n-doped area N1 of the photodiode FD1 is approx. 800 nm. A dimension parallel to the word line W1, which is parallel to the surface of the substrate 1, of the n-doped area N1 of the photodiode FD1 is approx. 600 nm. Under the n-doped area N1 a p-doped area (not shown) of the photodiode FD1 acts as part of the first substrate 1.

The conductive structure L1 extends from the doped area S/D1 up to the n-doped area N1 of the photodiode FD1. Between the doped area S/D1 and the n-doped area N1 of the photodiode FD1 the conductive structure L1 is separated by an insulation (not shown) from the first substrate 1. The conductive structure L1 is adjacent to the n-doped area N1 of the photodiode FD1 from above.

An approx. 800 nm thick first part of an intermediate oxide Z1 consisting of $SiO_2$ is arranged on the first substrate 1. The reference line R1 is arranged on the first part of the intermediate oxide Z1, which is connected via a contact KR1 to the second source/drain area S1 of the memory transistor TV1. The reference line R1 extends parallel to the word line W1.

An approx. 800 nm thick second part of the intermediate oxide Z1 is arranged on the first part of the intermediate oxide Z1. The bit line B1 is arranged on the second part of the intermediate oxide Z1, which extends vertically to the word line W1 and is connected via a contact KB1 to the second source/drain area A1 of the selection transistor TR1.

The word line W1 and the reference line R1 shade parts of the n-doped area N1 of the photodiode FD1 in such a way that the photoactive face of the photodiode FD1 is smaller than the n-doped area N1 of the photodiode FD1.

The diode ZD1 is formed by the doped area S/D1, the insulating layer I1 and the conductive structure L1.

An operating voltage $V_{DD}$, which is approx. 3.3 V, constantly lies on the reference line R1. 0V lies on the well in the first substrate 1 and consequently on the p-doped area of the photodiode FD1. The well is wired via a voltage connection (not shown).

In a second embodiment a second image sensor of an arrangement with image sensors includes a selection transistor TR2, a memory transistor TV2, a diode ID2 and a photodiode FD2, which are connected according to claim 2 (see FIG. 3).

The first source/drain area of the memory transistor TV2, a first source/drain area of the selection transistor TR2 and a n-doped area of the photodiode FD2 are arranged as cohesive doped area S/D2 in the second substrate 2 (see FIGS. 4*a* and 4*b*). The doped area S/D2 is adjacent to a surface of the second substrate 2.

The memory transistor TV2 and the selection transistor TR2 are designed as in the first embodiment. The doped area S/D2, a second source/drain-area S2 of the memory transistor TV2 and a second source/drain area A2 of the selection transistor TR2 are arranged in a row next to each other and at a distance from each other (see FIG. 4*b*). Between the doped area S/D2 and the second source/drain area A2 of the selection transistor the gate electrode of the selection transistor is arranged on the second substrate 2, which is part of a word line W2 and is separated by a gate insulator GD2 from the second substrate 2 (see FIGS. 4*a* and 4*b*).

The second source/drain area S2 of the memory transistor TV2 is part of the reference line R2, which extends as strip-shaped doped area parallel to the word line W2.

An insulating layer I2 and the gate electrode G2 of the memory transistor TV2 are arranged as in the first embodiment (see FIGS. 4*a* and 4*b*). The doped area S/D2 is arranged in a horseshoe-shape around half the gate electrode G2 of the memory transistor TV2 (see FIG. 4*a*). In order to prevent short-circuits the doped area S/D2 does not extend up to the reference line R2.

A conductive structure L2 consisting of n-doped polysilicon is arranged on the insulating layer I2 and on the gate electrode G2 of the memory transistor (see FIG. 4*b*). In contrast to the first embodiment, the conductive structure L2 is not adjacent in the vicinity of the photodiode FD2 to the second substrate 2. The conductive structure L2 is square from the top view with a side length of approx. 250 nm.

An approx. 800 nm thick intermediate oxide Z2 consisting of SiO2 is arranged on the second substrate 2. The bit line B2 is arranged on the intermediate oxide Z2, which extends vertically to the word line W2 and is connected via a contact KB2 to the second source/drain area A2 of the selection transistor TR2.

In a third embodiment a third substrate is provided with a third image sensor of an arrangement with image sensors, which has a selection transistor, a memory transistor, a diode and a photodiode, which are connected as in the first embodiment (see FIG. 1).

In contrast to the first embodiment the memory transistor is designed as a vertical MOS transistor. To this end an approx. 500 nm deep recess V3 is provided in the third substrate 3. Approx. 400 nm below a surface of the third substrate 3, from which the recess V3 originates, the reference line R3 is arranged in the form of a n-doped layer of the third substrate 3. The doping substance concentration of the reference line R3 is approx. $10^{19}$ $cm^{-3}$ (see FIGS. 5*b* and 5*c*). The recess V3 thus extends into the reference line R3. The reference line R3 serves as common reference line for all image sensors of the arrangement.

An approx. 2 nm thick insulating layer I3 consisting of $SiO_2$ is arranged on a lateral face of an upper area of the recess V3 (see FIG. 5*b*). In contrast to the insulating layers I1, I2 in the first two embodiments, the insulating layer I3 in this embodiment lies vertically to the surface of the third substrate 3. The insulating layer I3 extends approx. 100 nm into the third substrate 3.

Other faces of the recess V3 are provided with an approx. 6 nm thick gate insulator GD3 consisting of $SiO_2$ (see FIGS. 5*b* and 5*c*).

The gate electrode G3 of the memory transistor is arranged in a lower part of the recess V3 lying under the upper part. The gate electrode G3 of the memory transistor fills the recess V3 up to a height of approx. 100 nm.

A conductive structure L3 consisting of n-doped polysilicon is arranged over the gate electrode G3 of the memory transistor. The conductive structure L3 has a doping substance concentration of approx. $10^{19}$ $cm^{-3}$. The gate electrode G3 of the memory transistor and the conductive structure L3 together fill up the recess V3.

The first source/drain area of the memory transistor and a first source/drain area of the selection transistor form a cohesive n-doped area S/D3 in the third substrate 3, which is adjacent to the lateral face of the upper area of the recess V3, that is to say the insulating layer I3 (see FIG. 5*b*). The doped area S/D3 has a doping substance concentration of approx. $10^{20}$ $cm^{-3}$.

Part of the reference line R3, which is adjacent to the recess V3, acts as second source/drain area of the memory transistor.

An approx. 300 nm thick n-doped area N3 of the photodiode is provided in the substrate S3 adjacent to the surface of the third substrate 3, which is at a distance from the doped area S/D3. The n-doped area N3 has a doping substance concentration of approx. $10^{20}$ $cm^{-3}$ and is rectangular with side lengths of 800 nm and 600 nm (see FIGS. 5*a* and 5*c*). The n-doped area N3 is embedded in a p-doped area of the photodiode, which is part of a p-doped well in the third substrate 3 (see FIG. 5*c*).

The diode is formed by the doped area S/D3, the insulating layer I3 and the conductive structure L3.

The second source/drain area A3 of the selection transistor is designed as the selection transistor in embodiment 2 or embodiment 1. The same applies to the word line W3, which is separated by the gate insulator GD3 from the third substrate 3.

Between the n-doped area N3 and the recess V3 an insulation IS3 is provided in the third substrate.

An approx. 800 nm thick first part of an intermediate oxide Z3 consisting of $SiO_2$ is arranged on the third substrate 3 (see FIGS. 5*b* and 5*c*). Contacts K3 are arranged in the first part of the intermediate oxide Z3, which contact the conductive structure Z3 and the n-doped area N3 of the photodiode (see FIG. 5b).

The contacts K3 are connected with each other via a line Q3 arranged on the first part of the intermediate oxide Z3 (see FIGS. 5a and 5c).

An approx. 800 nm thick second part of the intermediate oxide Z3 is arranged on the first part of the intermediate oxide Z3. The bit line B3 is arranged on the second part of the intermediate oxide Z3 which extends vertically to the word line W3 and is connected via a contact B3 to the second source/drain area A3 of the selection transistor.

In a fourth embodiment a fourth substrate 4 is provided with a fourth image sensor of an arrangement with image sensors, which has a selection transistor, a memory transistor, a diode and a photodiode, which are connected as in the third embodiment (see FIG. 1).

The fourth image sensor is essentially designed as the third image sensor with the difference that no line is provided with associated contacts, which connects the conductive structure L4 to the n-doped area N4 of the photodiode. Instead the conductive structure L2 extends laterally up to the n-doped area N4 of the photodiode. The conductive structure L4 is arranged on the insulation IS4, the consequence of which is that the conductive structure L4 is only adjacent in the section of the n-doped area N4 of the photodiode to the fourth substrate 4 (see FIGS. 6a and 6b).

An approx. 800 nm thick intermediate oxide Z4 consisting of $SiO_2$ is provided, on which the bit line B4 is arranged and is connected via a contact (not shown) to the second source/drain area of the selection transistor.

As in the third embodiment a gate insulator GD4, a gate electrode G4 of the memory transistor, a common doped area S/D4, a second source/drain area A4 of the selection transistor, a reference line R4, a word line W4, a bit line B4 and an insulation IS4 are provided.

In a fifth embodiment a fifth substrate 5 is provided with a fifth image sensor of an arrangement with image sensors, which has a selection transistor, a memory transistor, a photodiode and a diode, which are connected as in the second embodiment (see FIG. 3).

The memory transistor, the selection transistor, an insulating layer I5, the word line W5, the reference line R5 and the bit line B5 are designed as in the fourth embodiment (see FIGS. 7a and 7b). Thus a second source/drain area A5 of the selection transistor, a gate insulator GD5, a contact KB5 to the bit line B5, an intermediate oxide 25 and a gate electrode G5 of the memory transistor are provided in a recess V5 as in the fourth embodiment.

In contrast to the fourth embodiment the n-doped area of the photodiode, the first source/drain area of the memory transistor and a first source/drain area of the selection transistor form a cohesive n-doped area S/D5. The doped area S/D5 has a rectangular cross-section with side lengths of approx. 700 nm and 800 nm. The lateral distance between the recess V5 and the word line W5 is 700 nm. The conductive structure L5 of the diode is arranged completely inside the recess V5 and is not adjacent to the fifth substrate 5 (see FIGS. 7a and 7b).

In a sixth embodiment a sixth substrate 6 is provided with a sixth image sensor of an arrangement with image sensors, which is designed corresponding to the fifth image sensor, with the difference that a lateral distance between the recess and the word line W6 is only 250 nm and the doped area S/D6 extends beyond an area between the recess and the word line W6 (see FIG. 8).

As in the fifth embodiment a first source/drain area of the selection transistor, a first source/drain area of the memory transistor and a n-doped area of the photodiode form a common doped area S/D6. As in the fifth embodiment the gate electrode of the memory transistor and the conductive structure L6 are arranged in a recess. As in the fifth embodiment a second source/drain area of the selection transistor and the bit line B6 are provided.

Many variations of the embodiments, which also fall within the scope of the invention, are conceivable. Thus dimensions of the described layers, structures, lines and areas can be adapted to the particular requirements. The same applies for the choice of the materials and for the doping substance concentrations.

The invention claimed is:

1. Arrangement with image sensors, in which an image sensor has a memory transistor and a selection transistor, which are connected in series and between a bit line or a reference line, in which a gate electrode of the selection transistor is connected to a word line, which extends crosswise in relation to the bit line, in which the image sensor has a diode, which is switched between a gate electrode of the memory transistor and a first source/drain area of the memory transistor, which is connected to the selection transistor in such a way that it is polarised towards the first source/drain area of the memory transistor and in the reverse direction, in which the image sensor has a photodiode, which is switched between a voltage connection and the gate electrode of the memory transistor in such a way that it is polarised towards the voltage connection and in the reverse direction.

2. Arrangement with image sensors, in which an image sensor has a memory transistor and a selection transistor, which are connected in series and between a bit line and a reference line, in which one gate electrode of the selection transistor is connected to a word line, which extends crosswise in relation to the bit line, in which an image sensor has a diode, which is switched between a gate electrode of the memory transistor and a first source/drain area of the memory transistor, which is connected to the selection transistor in such a way that it is polarised towards the first source/drain area of the memory transistor and in the reverse direction, in which an image sensor has a photodiode, which is switched between a voltage connection and the first source/drain area of the memory transistor in such a way that it is polarised towards the voltage connection and in the reverse direction.

3. Arrangement according to claim 1, in which the photodiode consists of a n-doped area and a p-doped area adjacent to this, which is connected to the voltage connection.

4. Arrangement according to claim 3, in which the n-doped area of the photodiode, the first source/drain area of the memory transistor and/or a first source/drain area of the selection transistor from a cohesive doped area.

5. Arrangement according to claim 1, in which the memory transistor is designed as a vertical transistor, in which the first source/drain area of the memory transistor is arranged over a second source/drain area of the memory transistor, which is connected to the reference line, in which the reference line is buried in the substrate.

6. Arrangement according to claim 1,
in which the diode is designed as a tunnel diode and consists of the first source/drain area of the memory transistor, an insulating layer adjacent to this and a conductive structure adjacent to this, which is connected to the gate electrode of the memory transistor.

7. Arrangement according to claim 6,
in which one substrate has a recess,
in which the recess extends into the reference line,
in which at least one lateral face of an upper area of the recess is provided with the insulating layer,
in which faces of a lower area of the recess lying below the upper part are equipped with a gate insulator,
in which the gate electrode of the memory transistors is arranged in the lower part,
in which the conductive structure of the diode arranged is in the upper part of the recess,
in which the first source/drain area of the memory transistor is arranged in the substrate and is adjacent to the lateral face of the upper area.

8. Arrangement according to claim 2,
in which the photodiode consists of a n-doped area and a p-doped area adjacent to this, which is connected to the % voltage connection.

9. Arrangement according to claim 8,
in which the n-doped area of the photodiode, the first source/drain area of the memory transistor and/or a first source/drain area of the selection transistor form a cohesive doped area.

10. Arrangement according to claim 2,
in which the memory transistor is designed as a vertical transistor,
in which the first source/drain area of the memory transistor is arranged over a second source/drain area of the memory transistor, which is connected to the reference line,
in which the reference line is buried in the substrate.

11. Arrangement according to claim 2,
in which the diode is designed as a tunnel diode and consists of the first source/drain area of the memory transistor, an insulating layer adjacent to this and a conductive structure adjacent to this, which is connected to the gate electrode of the memory transistor.

12. Arrangement according to claim 11,
in which one substrate has a recess,
in which the recess extends into the reference line,
in which at least one lateral face of an upper area of the recess is provided with the insulating layer,
in which faces of a lower area of the recess lying below the upper part are equipped with a gate insulator,
in which the gate electrode of the memory transistors is arranged in the lower part,
in which the conductive structure of the diode arranged is in the upper part of the recess,
in which the first source/drain area of the memory transistor is arranged in the substrate and is adjacent to the lateral face of the upper area.

* * * * *